United States Patent [19]

Nishizaki et al.

[11] Patent Number: 4,732,254

[45] Date of Patent: Mar. 22, 1988

[54] ELECTRONIC COMPONENT FEEDER

[75] Inventors: Genichi Nishizaki, Iruma; Keizo Shinano, Kodaira, both of Japan

[73] Assignee: Citizen Watch Co., Ltd., Tokyo, Japan

[21] Appl. No.: 859,086

[22] PCT Filed: Sep. 9, 1985

[86] PCT No.: PCT/JP85/00503

§ 371 Date: Apr. 24, 1986

§ 102(e) Date: Apr. 24, 1986

[87] PCT Pub. No.: WO86/01970

PCT Pub. Date: Mar. 27, 1986

[30] Foreign Application Priority Data

Sep. 10, 1984 [JP] Japan .................................. 59-188190

[51] Int. Cl.$^4$ .............................................. B65G 11/00
[52] U.S. Cl. ........................................ 193/38; 193/41; 198/347; 29/759; 29/741
[58] Field of Search ..................................... 193/38-41; 198/347; 209/573; 406/74; 29/740, 741, 759

[56] References Cited

U.S. PATENT DOCUMENTS 4,000,798  1/1977  Cedrone ............................... 193/40
4,506,213  3/1985  O'Connor ......................... 324/158 F

FOREIGN PATENT DOCUMENTS 44409  3/1985  Japan ..................................... 193/38

Primary Examiner—Sherman D. Basinger
Assistant Examiner—Paul E. Salmon
Attorney, Agent, or Firm—Koda and Androlia

[57] ABSTRACT

In a feeder for carrying electronic components in a predetermined sequence such as ICs packed in a cassette, stick or the like in an electronic insertion machine, part of a carrying path is made movable between the two positions; a component passing position in a usual state and a waiting position outside the carrying path, whereby in the case of incorrect insertion of an electronic component, a new identical component can be supplied by leaving behind the components of the sequential order.

3 Claims, 5 Drawing Figures

4,732,254

ELECTRONIC COMPONENT FEEDER

TECHNICAL FIELD

This invention relates generally to an electronic component insertion machine for inserting automatically electronic components into the holes in a printed-circuit board in a predetermined sequence, and more particularly to a novel structure of an insertion machine having an electronic component feeder provided between a taking-out device (for taking out stacked IC components, one by one) and an insertion head for holding the electronic components and inserting them into the holes in the printed-circuit board.

BACKGROUND OF THE ART

Conventionally various electronic component insertion machines have been provided for automatically inserting and fixedly securing, such electronic components as integrated circuits, semiconductors, registors and capacitors into the holes in a printed-circuit board in a predetermined sequence (e.g. Japanese Published Unexamined Patent Application No. 58-114494). These insertion machines are designed to convey sequentially electronic components from a cassette (stick) or to convey continuously many identical components to the insertion head. Especially when feeding integrated circuits, the components are properly oriented by way of various working stations, for example, a station for correcting deformed leads and a station for detecting the polarity and reversing it if necessary, along a carrying path extended from a taking-out device such as a cassette and a stick to an insertion head. Then, these properly oriented components are conveyed to the insertion head, inserted into the predetermined inserting position in the printed-circuit board, and fixedly secured in that position in the printed-circuit board. However, it is difficult to insert successfully all the IC (integrated circuit) components pupplied to the insertion head, and therefore, conventionally, in case where an incorrect insertion takes place, the insertion machine is stopped, the IC component incorrectly inserted is removed from the printed-circuit board, then the operation of the machine is restarted with the insertion of the next IC component for sequential operation. After all the insertions are finished, in the inserting position where the incorrect insertion has taken place, a new identical IC component is reinserted manually or by use of the insertion head. However, manual insertion has recently become difficult, since the density of ICs in the printed-circuit board has been increasing, thereby extremely reducing the clearance gap between the neighboring IC components. On the other hand, in the case of using the insertion head, the insertion head touches the neighboring IC components already secured in the holes, thus making impossible the inserting operation with the insertion head, depending on the case.

Accordingly, the present invention provides an electronic component feeder wherein in case where an incorrect insertion takes place, the IC components already fed to the carrying path are moved to a waiting position, and then, another IC component identical with the incorrectly inserted IC component is conveyed and reinserted so that the inserting operation can be continued in the predetermined sequence, and the feeder is applied to not only the aforementioned IC components but also electronic components being conveyed in each of components along the carrying path from the component taking-out device such as a cassette and a stick.

DISCLOSURE OF THE INVENTION

In accordance with the present invention, in an electronic component feeder for carrying electronic components to be inserted into the holes in a printed-circuit board from a component taking-out device in the predetermined sequence, before or after the working station equipped in a carrying path extended between the component taking-out device and the insertion head, there are provided a standby receptacle for electronic components; and a laterally moving means for moving laterally the standby receptacle between two positions, i.e. a passing position within the carrying path and a waiting position spaced away from the passing position, wherein in case where an incorrect insertion happens to a printed-circuit board, the electronic components already fed into the standby receptacle are moved to the standby position together with the standby receptacle by means of the laterally moving means, and a new identical electronic component is fed again along the carrying path so that the inserting operation to the printed-circuit board can be performed in the predetermined sequence.

BEST MODE FOR CARRYING OUT THE INVENTION

One form of the present invention will now be described in detail by way of example and with reference to the accompanying drawings.

EMBODIMENT

Figure 1:
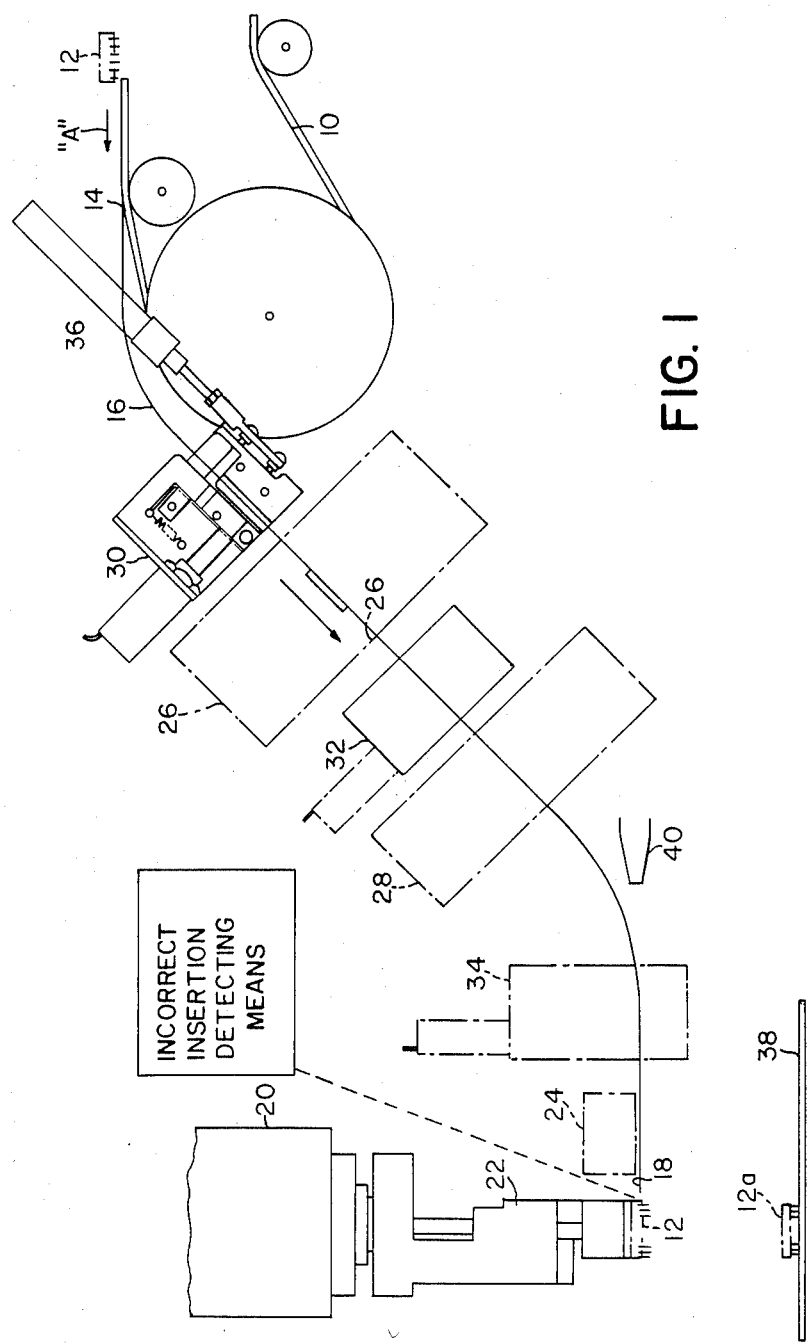
FIG. 1 is a schematic view showing the complete construction of an embodiment of an electronic component feeder in accordance with the present invention.

FIG. 1 is a schematic view illustrating the embodiment of the electronic component feeder in accordance with the present invention applied to the conveyance of IC components.

In FIG. 1, a belt conveyor 10 is provided as a conveying means for carrying IC components 12 in the direction of the arrow "A". This belt conveyor 10 carries each of IC components taken in the predetermined sequence out of a taking-out device, e.g. a stick type component taking-out device located in an upstream portion of the belt conveyor. The IC component at an outlet 14 is transmitted to a progressive carrying path 16 with inertial force. This carrying path 16 conveys IC component 12 downward by gravity. At a horizontal end 18 of the carrying path 16, for example, a known supplying chuck device 24 with an air-cylinder supplies IC component 12 to the insertion chuck 22 provided on the head for inserting ICs in the holes in the printed-circuit board. In the carrying path 16, a plurality of working stations are provided between the outlet 14 of the conveyor 10 and the horizontal end 18. In the embodiment shown, for example, a lead correcting station 26 for correcting a deformed lead of IC component 12 and a polarity detecting and reversing station 28 for seeing whether the conveyed IC component 12 is properly oriented or not and reversing it if necessary. Since the structures of these stations 26 and 28 have been used in conventional automatic electronic component insertion machines, a further description will be omitted. Before or after these working stations, standby stations are provided, and in the illustrated embodiment, a first standby station 30 is provided before the lead correcting station 26, a second standby station 32 is provided before the polarity detecting and reversing station 28, and a third standby station 34 is provided after the polarity detecting and reversing station 28. While the insertion head 20 is performing an inserting operation at the predetermined operating cycle, the first, second and third standby stations 30, 32 and 34 hold the subsequent IC components 12 ready to feed them to the insertion chuck 22. For this purpose, as will be discussed later, each of the standby stations 30, 32 and 34 is equipped with a standby receptacle for holding IC component 12 and is designed so that when the IC component held in the receptacle is released from its standby receptacle, the IC component descends by gravity and advances downward along the carrying path 16. First, second and third standby stations 30, 32 and 34 are of the same construction but are operated individually. Moreover, as a further feature of the present invention, first, second and third standby stations 30, 32 and 34 are designed so that in case where an incorrect insertion takes place during the inserting operation by the insertion head 20, another IC component 12 which is identical with the incorrectly inserted component is fed from the component taking-out device on the upstream side of the conveyor 10 and supplied to the insertion chuck 22 of the insertion head 20 before the other IC components held in the first, second and third standby stations are supplied thereto, thereby allowing a reinserting operation, that is to say, in operation, the IC components already held are moved to the waiting position to pass the new identical IC component 12 being reinserted in advance.

The first standby station 30 typically shows mechanisms such as a cylinder device 36 for actuating the waiting operation, and the similar means are equipped in the second and third stations 32 and 34, which will be discussed later. Now, the inserting operation by the insertion head 20 will be described. When IC component 12 is supplied to the insertion chuck 22 by the supplying chuck device 24, the insertion head 20 travels downward and inserts the leads of the IC component 12 into the inserting holes formed in a printed-circuit board 38 which has been placed beneath the chuck 22 beforehand. The position of the inserting hole in the printed-circuit board 38 is determined by the horizontal and rotary movements of a table for mounting the printed-circuit board 38. The IC component 12a shown in FIG. 1 is the one inserted and secured on the printed-circuit board 38 in the manner mentioned above. In this figure, 40 denotes an air jet device for accelerating the sliding force by gravity in the horizontal end from the third standby station 34 to the supplying chuck device 24. This device 40 is operated as necessary and carries the IC component 12 by air jet.

Figure 2:
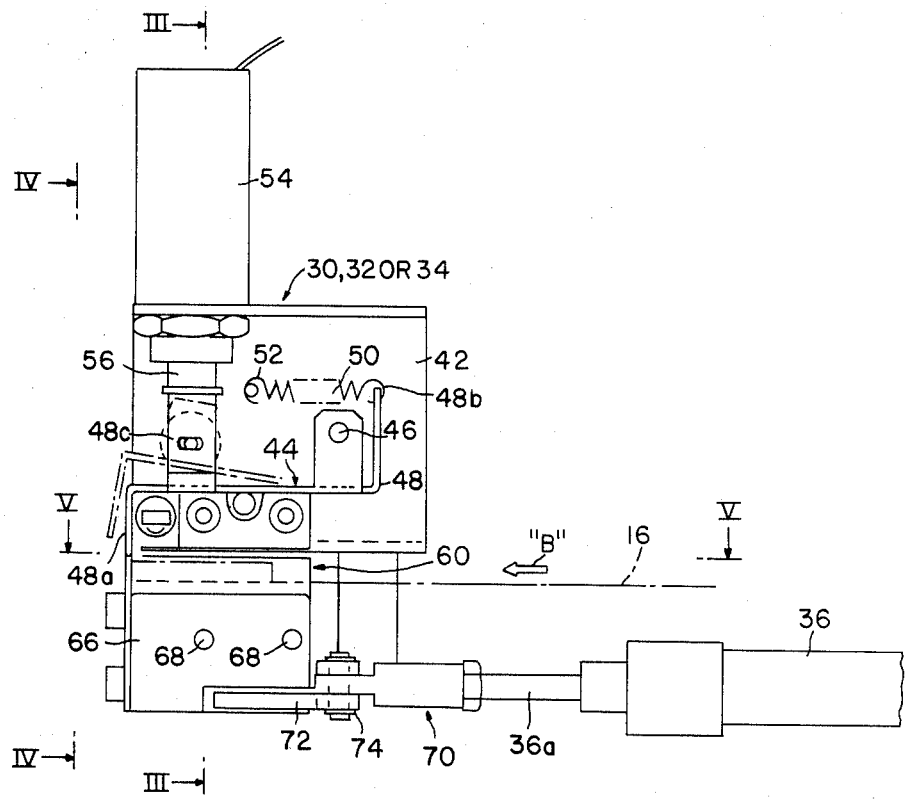
FIG. 2 is a front view showing details of the construction of a standby station equipped in the same feeder.
Figure 3:
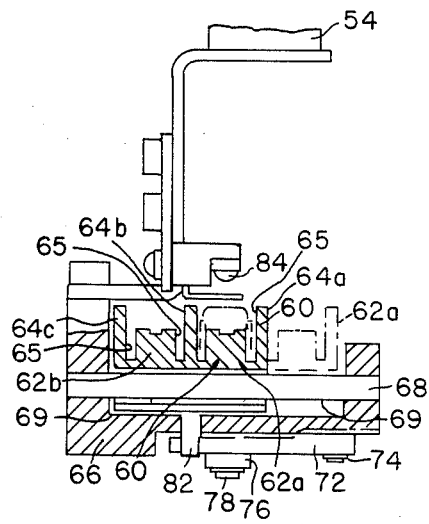
FIG. 3 is a sectional view taken along the line III—III of FIG. 2.
Figure 4:
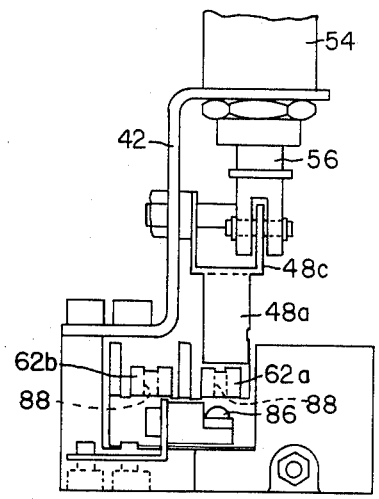
FIG. 4 is a side view taken along the line IV—IV of FIG. 2.
Figure 5:
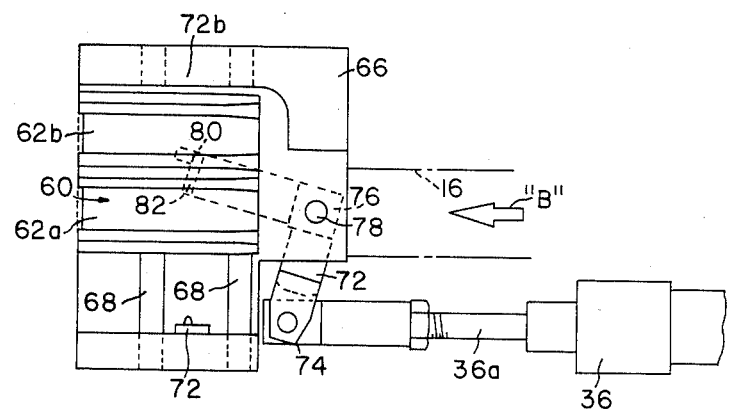
FIG. 5 is a plan view taken along the line V—V of FIG. 2.

FIGS. 2 to 5 are views illustrating details of the structure equipped in each of the above first, second and third standby stations 30, 32 and 34, in which FIG. 2 is a front view; FIG. 3 is a sectional view taken along the line III—III; FIG. 4 is a side view taken along the line IV—IV; and FIG. 5 is a plan view taken along the line V—V.

In FIGS. 2 to 5, each of first, second and third standby stations includes stop mechanism 44 for standing by IC component 12, the mechanism being attached to a bracket 42 provided on the upper side of the carrying path 16; a standby receptacle 60 provided in the path for holding the IC component 12 conveyed along the carrying path 16; and a laterally moving means 70 for moving laterally the standby receptacle 60 in the direction substantially perpendicular to the component carrying direction (arrow B). The standby receptacle 60 includes first and second receptacles 62a and 62b for receiving IC components 12. These receptacles 62a and 62b are parallel with each other in the direction perpendicular to the drawing sheet of FIG. 2 at right angles to the component carrying direction and define guide channels 65 for passing the leads of IC component 12 (DIP type IC in the illustrated embodiment) by side walls 64a, 64b and 64c (FIG. 3) standing on each side of both receptacles 62a and 62b. The standby receptacle 60 thus including both receptacles 62a and 62b is slidably disposed through a proper sliding bearing 69 in the direction perpendicular to the drawing sheet of FIG. 2 (hereinafter called lateral direction) at right angles with respect to the carrying direction B along two horizontal bars 68 fixed to a lower bracket 66. This receptacle 60 is adapted to make a damp stop by means of both stops 72a and 72b (FIG. 5) fixed to the lower bracket 66. Normally, both the receptacles 62a and 62b of the standby receptacle 60 are kept in position where one receptacle 62a passes or holds the IC component 12 conveyed along the carrying path 16, that is, in the component passing position aligned with the carrying path 16. When one receptacle 62a laterally moves to the waiting position shown in a dot and dash line in FIG. 3, the other receptacle 62b moves to the component passing position aligned with the carrying path 16. At this time, when IC component 12 has already held in the receptacle 62a, it is moved to the waiting position together with the receptacle 62a.

The stop mechanism 44 held in the bracket 42 has a stop arm 48 pivotable about a support shaft 46 mounted on the bracket 42. One end of the stop arm 48 is formed as a bent stop hook 48a, which is pivotably displaced between the following two positions; a lower stop position as shown in FIGS. 2 and 4 for preventing the IC component from advancing along the receptacle 62a or 62b located in the component passing position and holding it in the receptacle 62a or 62b; and an upper release position shown in a dot and dash line in FIG. 2. The other end of the stop arm 48 is formed as a bent spring engaging end 48b. This spring engaging end 48b is engaged with the one end of a tension spring 50 whose other end is engaged with a holding pin 52 of the bracket 42. This tension spring 50 always biases the spring engaging end 48b. Thus a torque acts on the stop arm 48 in a counterclockwise direction in FIG. 2 about its support shaft 46 to force the stop hook 48a into the lower stop position. In the position near the stop hook 48a of the stop arm 48 is formed a coupling arm 48c coupled to a plunger 56 of a solenoid 54 mounted on the bracket 42. When the solenoid 54 is actuated to attract the plunger 56 upwards, the stop arm 48 turns around the support shaft 46 clockwise in FIG. 2 against the tension of the spring 50. As a result, the stop hook 48a of the arm 48 moves to the upper release position (the position shown in a dot and dash line of FIG. 2). In the standby receptacle 60 located beneath, therefore, IC component 12 is ready for passing through the receptacle 62a or 62b and advancing along the carrying path 16.

Now, as mentioned above, the laterally moving means 70 is provided for moving laterally the receptacles 62a and 62b of the standby receptacle 60 between the two positions; the passing position and the waiting position along the horizontal bars 68, and the cylinder device 36 is used as an operating source. This cylinder device 36 is an ordinary one such as an air cylinder (a solenoid may be used) which operates to pull in the piston rod 36a with a command signal and to pull it out by a release of the command. The end of the piston rod 36a is, as shown in FIG. 5, coupled to one end of an L-shaped lever 72 pivoted on a support shaft 78 at its bent portion 76. The support shaft 78 is mounted on the lower bracket 66 under the carrying path 16 and swivelling to operate the cylinder device 36 (see FIG. 3). The other end 80 of the L-shaped lever 72 is formed with a groove for holding pivotally a pin 82 mounted on the lowest portion of the standby receptacle 60.

The laterally moving means 70 thus constructed allows the L-shaped lever 72 to turn around the support shaft 78 in FIG. 5 when the piston rod 36a of the cylinder device 36 is pushed out and the standby receptacle 60 moves toward the stop 72a along the horizontal bars 68 through the pin 82 held in the other end 80 of the L-shaped lever. That is to say, one receptacle 62a of the standby receptacle 60 is moved from the passing position to the waiting position, while the other receptacle 62b is moved from the waiting position to the passing position. When in this state the piston rod 36a of the cylinder device 36 projects, then the receptacle 62a returns to the passing position and the receptacle 62b returns to the waiting position. Usually, as stated above, the receptacle 62a is kept in the passing position.

As shown in FIGS. 3 and 4, a light emitting device 84 and a light receiving device 86 act as detectors for seeing whether the IC component 12 is located in the component passing position of the standby receptacle 60 or not. These devices 84 and 86 are arranged opposite to each other and allow detecting by transmitting or blocking the light through light transmission holes 88 formed in the receptacles 62a and 62b.

Now, operation of first, second and third standby stations 30, 32 and 34 so constructed will be discussed.

While IC components 12 are normally inserted into the holes in the printed-circuit board 38 by the insertion head 20 shown in FIG. 1 in the predetermined inserting sequence to supply from the component taking-out device, at each standby station 30, 32 and 34, one receptacle 62a of the standby receptacle 60 located in the component passing position cooperates with the stop mechanism 44 for holding or advancing IC component 12 by proper stop or release. That is to say, the solenoid 54 at each station is controlled to operate with the predetermined operating timing and to feed a various types of IC components 12 along the carrying path 16 on downstream in the predetermined sequence.

On the other hand, in case where an incorrect insertion takes place during the inserting operation by the insertion head 20 and is detected by detecting means for detecting the incorrect insertion, by its signal output the operation of the insertion head 20 stops, the incorrect insertion is displayed and the incorrectly inserted IC component 12 is removed manually or the like. In the meantime, in first, second and third standby stations 30, 32 and 34, by the detection of the incorrect inserting, the standby receptacle 60 is moved by the laterally moving means 70. At this time, the previous process at the working stations 26 and 28 have already completed the operation cycle and in the carrying path 16, IC component 12 is held in one recepatcle 62a of the standby receptacle 60. Therefore, by the above motion of the standby receptacle 60, the receptacle 62a holding IC component 12 is transferred to the waiting position, in which proper holding means actuates for holding the IC component 12. And, the other receptacle 62b moves to the component passing position and thus the carrying path 16 is all vacant. Then an identical component is carried from the component taking-out device in the course of the conveyor 10, the carrying path 16 and the working stations 26 and 28 to the supplying chuck device 24, and the insertion head 20 restarts inserting the IC component 12 thus carried. After the inserting operation has been completed, the IC components 12 in the standby receptacles 60 at the first, second and third standby stations return to the respective component passing positions. As a result, all the IC components 12 are completely inserted into the holes in the printed-circuit board 38 as if they have been inserted in the same sequence as in the predetermined one.

Although in the above-mentioned embodiment, the component is limited to an IC component, the electronic component feeder of the invention is of course not limited to the above IC component, and it is needless to say that the invention can be used for all electronic components conveyed from the component taking-out device to the insertion head. Also, the aforementioned embodiment has described the structure in which the standby receptacle is laterally moved in a substantially horizontally perpendicular direction to the lateral direction with respect to the component carrying direction of the carrying path. However, if desired, the invention can be carried out in the direction vertically perpendicular with respect to the carrying path.

Industrially Applicable Possibilities

As clearly shown in the aforementioned description, according to the present invention, in case where an incorrect insertion takes place during the time that a variety of electronic components having different shapes and sizes are inserted into the holes in the printed-circuit board in the predetermined inserting sequence, the electronic components already conveyed from the component taking-out device to the working station are moved to the waiting position, and an identical component is carried from the taking-out device. Therefore, it is possible to insert the electronic component into the holes in the printed-circuit board in the predetermineed inserting sequence. Even in the condition where the density on a printed-circuit board is too high to reinsert the electronic component after operation in conventional manners, there will produce no wrong printed-circuit board, and the effective insertion of electronic components into the holes in the printed-circuit board can be accomplished.

We claim:

1. In an electronic component feeder for carrying electronic components to be inserted into holes in a printed-circuit board froma a component taking-out device to an insertion head in a predetermined sequence in an automatic electronic component insertion machine, said automatic electronic component insertion machine having said electronic component feeder; and an incorrect insertion detecting means for detecting any incorrect insertion caused when the electronic component is inserted into one of the holes in the printed-circuit board by the insertion head, characterized in that said electronic component insertion feeder is provided with at least one standby receptacle means for the electronic components which at least one standby receptacle means is provided before or after a working station equipped in a carrying path extended between said component taking-out device and said insertion head; and at least one laterally moving means for moving laterally said at least one standby receptacle means between two positions, a passing position located within said carrying path and a waiting position located outside said carrying path, said passing position permitting the passage of the components along a first path, said waiting position being only for holding the components and not permitting the passage of the components and its carrying path being formed by a second path; each of said at least one laterally moving means moving all the standby receptacle means simultaneously to the waiting positions when any incorrect insertion has been detected by said incorrect insertion detecting means, whereby a new component can pass the arranged components being carried without changing said arrangement.

2. The electronic component feeder according to claim 1 wherein each of said at least one standby recepatacle means for electronic components comprises a first receptacle and a second receptacle deposited in parallel with each other in the direction substantially perpendicular to the carrying direction of said electronic components, said first receptacle usually forming a part of the carrying path and moving the components to the waiting positions with each component kept therein at the time of waiting, and said second receptacle forming a part of the carrying path only at the time of waiting, and wherein each of said at least one laterally moving means moves laterally said first and second receptacles as one united body in said perpendicular direction to move said first receptacle from said passing position to said waiting position so that said second receptacle can be positioned in said passing position at the time of waiting.

3. The electronic component feeder according to claim 2 wherein each of said at least one laterally moving means has one end engaged with said first and second receptacles and comprises an L-shaped lever pivoted on its bent corner thereof and a linear-driving cylinder engaged with the other end of said L-shaped lever.

* * * * *